(12) United States Patent
Mistuhashi

(10) Patent No.: US 7,906,431 B2
(45) Date of Patent: Mar. 15, 2011

(54) SEMICONDUCTOR DEVICE FABRICATION METHOD

(75) Inventor: Toshiro Mistuhashi, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 26 days.

(21) Appl. No.: 12/272,313

(22) Filed: Nov. 17, 2008

(65) Prior Publication Data

US 2009/0130846 A1    May 21, 2009

(30) Foreign Application Priority Data

Nov. 19, 2007    (JP) ................................ 2007-299518

(51) Int. Cl.
*H01L 21/28* (2006.01)
*H01L 21/44* (2006.01)

(52) U.S. Cl. ................ 438/675; 438/637; 257/E21.577; 257/E21.578

(58) Field of Classification Search ........................ None
See application file for complete search history.

(56) References Cited

U.S. PATENT DOCUMENTS 7,399,683 B2 *   7/2008   Noma et al. ................... 438/465
7,589,390 B2 *   9/2009   Yao ............................... 257/503

FOREIGN PATENT DOCUMENTS

JP    2007-180529    12/2007

* cited by examiner

*Primary Examiner* — Jarrett J Stark
(74) *Attorney, Agent, or Firm* — Taft Stettinius & Hollister LLP

(57) ABSTRACT

Methods of fabricating a semiconductor device including a through-silicon via that is electrically insulated from the semiconductor substrate. An exemplary method includes preparing a semiconductor wafer including a semiconductor substrate, a semiconductor element, an interlayer insulating, pads that are electrically connected to the semiconductor element, and a protective film; forming upper terminals electrically connected to the pads; forming annular grooves below the pads and extending to the interlayer insulating film; forming an annular insulating layer in the annular grooves and forming a bottom insulating film on the bottom surface of the semiconductor substrate; forming electrode-forming extending to the pads; filling the electrode-forming holes with a conductive material to form through-silicon vias electrically connected to the pads; and forming lower terminals on the bottom insulating film electrically connected to the through-silicon vias.

18 Claims, 13 Drawing Sheets

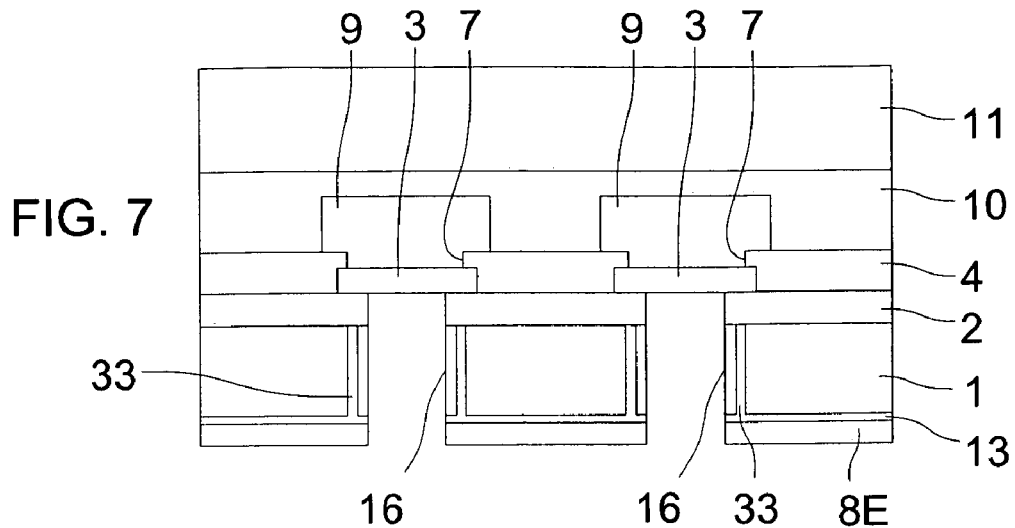
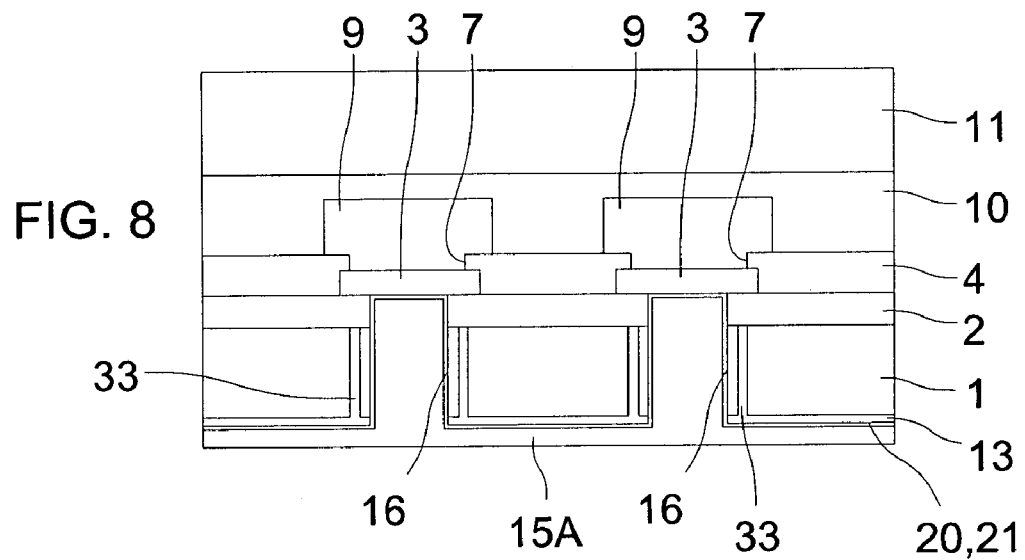
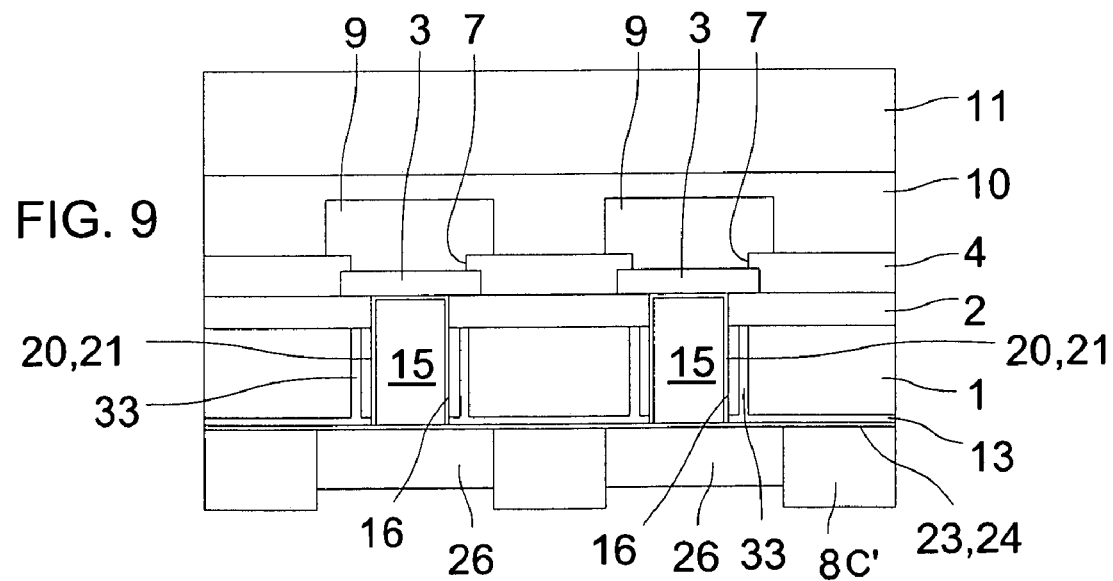

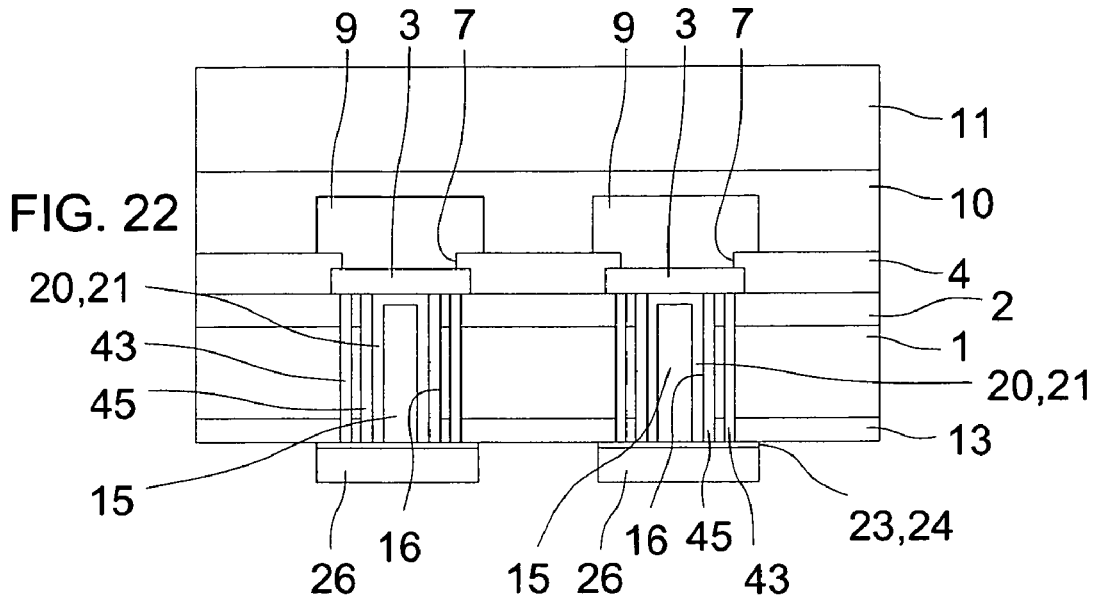
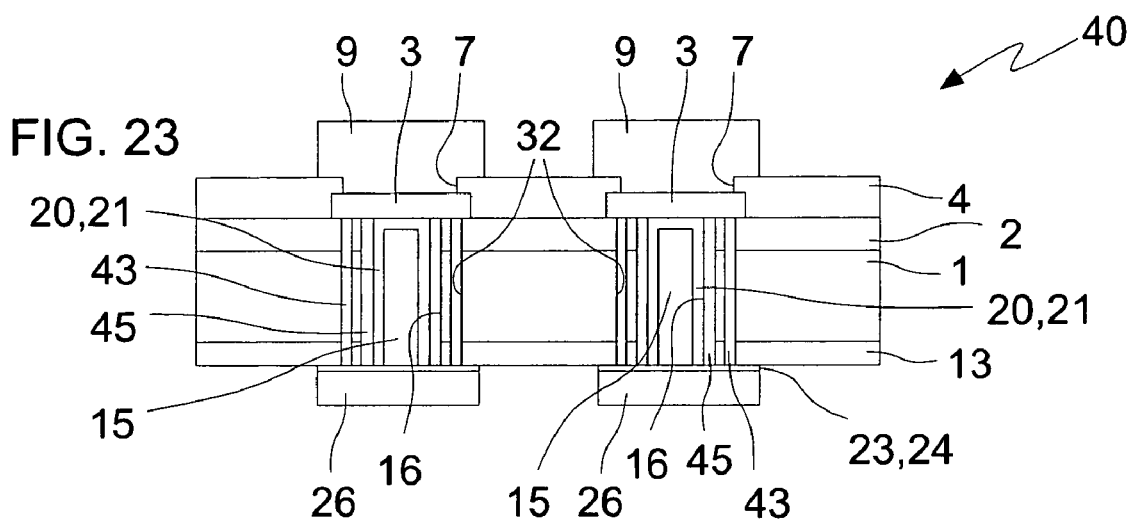
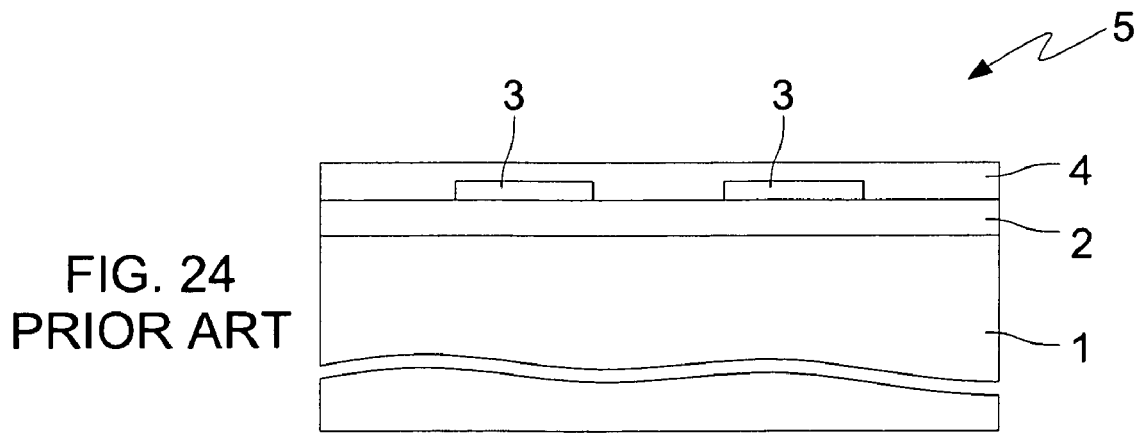

SEMICONDUCTOR DEVICE FABRICATION METHOD

CROSS REFERENCE TO RELATED APPLICATION

This application claims the benefit of Japanese Patent Application No. 2007-299518, filed Nov. 19, 2007, which is incorporated by reference.

BACKGROUND

The present disclosure relates to methods for fabricating a semiconductor device having a through-silicon via (TSV).

In recent years, a technique for forming small-size, large-capacity, and highly functional semiconductor devices by stacking a plurality of semiconductor devices having a through-silicon vias has been developed.

Through-silicon vias may be formed in semiconductor devices using several methods. For example, a via-first method forms a through-silicon via prior to forming the semiconductor element (such as a transistor) in the semiconductor wafer, and a via-last method forms the through-silicon via after forming the semiconductor element. In semiconductor devices utilized in devices such as an image sensor, the through-silicon via is often formed by the via-last method.

The following description of a conventional method of fabricating a semiconductor device having a through-silicon via formed by a via-last method refers to FIGS. 24-34. In the step shown in FIG. 24, a semiconductor wafer 5 including a non-illustrated semiconductor element on a top surface of a silicon substrate 1, serving as a semiconductor substrate and formed of silicon (Si); an interlayer insulating film 2 formed of silicon oxide ($SiO_2$) on the top surface of the silicon substrate 1; pads 3 formed of a conductive material (such as aluminum) selected from a group of conductive materials including aluminum (Al), titanium (Ti), copper (Cu), nickel (Ni), and solder on the interlayer insulating film 2 and electrically connected to predetermined portions of the non-illustrated semiconductor element; and a passivation film 4, serving as a protective film, formed of silicon nitride ($Si_3N_4$) and configured to cover upper portions of the interlayer insulating film 2 and the pads 3.

In the step shown in FIG. 25, a resist mask (not illustrated) is formed on the passivation film 4 using a photolithography process, leaving exposed portions of the passivation film 4 corresponding to regions of the pads 3 where openings 7 are to be formed. Using the resist mask as a mask, the openings 7 extending to the pads 3 are formed by an anisotropic etching process. Thereafter, the resist mask is removed using a remover.

Subsequently, another resist mask 8A is formed on the passivation film 4 using a photo/lithography process, leaving exposed portions of the passivation film 4 corresponding to regions including the openings 7 where upper electrodes 9 are to be formed. Then, the openings 7 and the openings of the resist mask 8A are filled with a conductive material (such as nickel) by an electroplating method to form upper terminals 9, which are electrically connected to the pads 3.

In the step shown in FIG. 26, the resist mask 8A used for forming the upper terminals 9 is removed using a remover, and a support member II is bonded onto the upper terminals 9 and the passivation film 4 on the top surface side of the silicon substrate 1 using a bonding material 10.

In the step shown in FIG. 27, the bottom surface of the silicon substrate 1 is polished using a grinder, so that the silicon substrate 1 becomes a thin plate having a predetermined thickness (about 50 μm, for example).

In the step shown in FIG. 28, a bottom insulating film 13 of an insulating material (such as silicon oxide) is formed on the bottom surface of the polished silicon substrate 1 by a CVD (chemical vapor deposition) method. Thereafter, another resist mask 8B exposing portions of the bottom insulating film 13 corresponding to regions below the pads 3 where through-silicon vias (TSV) 15 are to be formed is formed on the bottom insulating film 13 by a photolithography process.

In the step shown in FIG. 29, the bottom insulating film 13 and the silicon substrate 1 are etched by an anisotropic etching process to form pilot holes extending to the interlayer insulating film 2 using the resist mask 8B formed in the step of FIG. 28 as a mask. Electrode-forming holes 16 extending to the pads 3 are formed. Using the same resist mask 8B as a mask, the interlayer insulating film 2 exposed to bottom portions of the pilot holes is etched by an anisotropic etching process using a different etching gas.

In the step shown in FIG. 30, the resist mask 8B formed in step of FIG. 28 is removed by a plasma ashing process, and an insulating material (such as silicon oxide) is deposited on the bottom insulating film 13 and the inner surfaces (i.e., the end and side surfaces) of the electrode-forming holes 16 by a CVD method, so that an electrode insulating film 18 covers the bottom insulating film 13 and the inner surfaces of the electrode-forming holes 16.

In the step shown in FIG. 31, the surfaces on the bottom of the silicon substrate 1 are etched by an anisotropic etching process to remove the electrode insulating film 18 formed on the bottom insulating film 13 and the end surfaces of the electrode-forming holes 16, while the electrode insulating film 18 covering the side surfaces of the electrode-forming holes 16 remains. A conductive material (such as titanium) is deposited by a sputtering process on the bottom insulating film 13, the pads 3 (the end surfaces of the electrode-forming holes 16), and the electrode insulating film 18 disposed on the side surfaces of the electrode-forming holes 16, thereby forming a barrier metal layer 20. Thereafter, a conductive material (such as copper) is deposited thereon by a sputtering process to form a seed metal layer 21, and a conductive material layer 15A of a conductive material (such as copper) is formed on the seed metal layer 21 using an electroplating method. In this way, the electrode-forming holes 16 are filled with the conductive material (such as copper).

In the step shown in FIG. 32, the barrier metal 20, the seed metal 21, and the conductive material layer 15A on the bottom insulating film 13 are removed by a CMP (chemical mechanical polishing) method. Through-silicon vias (TSV) 15 in the electrode-forming holes 16 are electrically connected to the pads 3.

Thereafter, a conductive material (such as titanium) is deposited by a sputtering process to form another barrier metal layer 23. Subsequently, a conductive material (such as copper) is deposited thereon by a sputtering process to form another seed metal layer 24. Another resist mask 8C having openings exposing portions of the seed metal layer 24 corresponding to regions including the through-silicon vias (TSV) 15 where lower electrodes 26 are to be formed is formed on the seed metal layer 24 by a photolithography process. The openings of the resist mask 8C are filled with a conductive material (such as nickel) by an electroplating method, so that lower terminals 26 are formed and are electrically connected to the through-silicon vias (TSV) 15.

In the step shown in FIG. 33, the resist mask 8C used for forming the lower terminals 26 is removed using a remover, and portions of the barrier metal layer 23 and the seed metal layer 24 are removed by a wet etching process to expose the bottom insulating film 13.

In the step shown in FIG. 34, the bonding material 10 is removed to separate the support member 11, thereby forming a semiconductor device 28. In this way, a semiconductor device having a through-silicon via (TSV) is formed using a conventional fabrication method.

A conventional via-first method of forming a through-silicon via (TSV) is disclosed in Japanese Laid-Open Patent Application No. 2007-180529 (refer to, for example, paragraphs [0034] to [0038], on pages 10 and 11, and FIGS. 3, 4 and 7), which is incorporated by reference. Prior to forming a semiconductor element in a semiconductor wafer, insulating rings are formed in portions of a semiconductor substrate where through-silicon vias (TSV) are to be formed, and the semiconductor element and a wiring layer are successively formed in the semiconductor substrate. Thereafter, the semiconductor wafer is divided into semiconductor chips, each having a semiconductor element and an insulating ring formed thereon, and the semiconductor chip is mounted on a mounting substrate. The bottom surface of the semiconductor chip is polished until the insulating ring is exposed, and an inorganic insulating film formed of silicon oxide or silicon nitride is formed on the bottom surface of the semiconductor chip. A resist mask having openings corresponding to the through-silicon via (TSV) forming regions is formed on the inorganic insulating film, and through holes are formed by a dry etching process, penetrating through the inorganic insulating film and the semiconductor substrate of the semiconductor chip and extending to contact plugs embedded in an insulating film of the wiring layer. Thereafter, the through holes are filled with metal using an electroplating process, thereby forming the through-silicon vias (TSV).

However, according to the above-described conventional via-last fabrication method, upon forming of the through-silicon via (TSV), the electrode-forming holes are formed so as to extend from the bottom insulating film formed on the bottom surface of the silicon substrate to the pads, and the electrode insulating film is formed so as to cover the inner surfaces of the electrode-forming holes. Thereafter, the electrode insulating film is removed from the end surfaces of the electrode-forming holes by an anisotropic etching process, and a conductive material is filled in the electrode-forming holes by an electroplating method, thereby forming through-silicon vias (TSV). Therefore, when the electrode insulating film is removed from the end surfaces of the electrode-forming holes by the anisotropic etching process, the electrode insulating film is often removed from the side surfaces of the electrode-forming holes. When a portion of the electrode insulating film is removed, the through-silicon vias (TSV) and the silicon substrate may be electrically short-circuited, and, thus, the quality of the semiconductor device may be reduced.

Moreover, though the technique of Japanese Laid-Open Patent Application No. 2007-180529 is one type of via-first method, such a via-first method may present a problem when a first company entrusts a second company with fabrication of a semiconductor wafer having a semiconductor element formed thereon. Specifically, the first company may need to rely on the second company to form the insulating ring or the like.

Introduction

The exemplary methods described herein have been developed to obviate the above-described problems, and an object of the exemplary methods is to provide a method for fabricating a semiconductor device having a through-silicon via (TSV) capable of preventing short-circuiting between the through-silicon via (TSV) and a semiconductor substrate.

In a first aspect, a method of fabricating a semiconductor device, the semiconductor device including a semiconductor wafer including a semiconductor substrate, a semiconductor element formed over a top surface of the semiconductor substrate, an interlayer insulating film formed over the top surface of the semiconductor substrate, a pad formed over the interlayer insulating film and electrically connected to the semiconductor element, and a protective film covering upper portions of the interlayer insulating film and the pad, may include forming an annular groove extending from a bottom surface of the semiconductor substrate beneath the pad to the interlayer insulating film; forming an annular insulating layer in the annular groove and a bottom insulating film beneath the bottom surface of the semiconductor substrate by depositing an insulating material in the annular groove and on the bottom surface of the semiconductor substrate; forming an electrode-forming hole in a region circumscribed by the annular insulating layer, the electrode-forming hole extending from the bottom insulating film to the pad; forming a through-silicon via electrically connected to the pad by depositing a conductive material in the electrode-forming hole; and forming a lower terminal beneath the bottom insulating film and electrically connected to the through-silicon via.

In a detailed embodiment of the first aspect, the method may include, prior to the step of forming the annular groove, forming an upper terminal electrically connected to the pad by forming an opening in the protective film extending to the pad and depositing a conductive material in the opening.

In another detailed embodiment of the first aspect, the electrode-forming hole may be radially spaced apart from the annular insulating layer. In a further detailed embodiment, the electrode-forming hole and the annular insulating layer may be radially interposed by a residual portion of the semiconductor substrate.

In another detailed embodiment of the first aspect, a plurality of annular insulating layers may be formed around the through-silicon via. In a further detailed embodiment, the annular insulating layers may be arranged concentrically around the through-silicon via.

In another detailed embodiment of the first aspect, the method may include, prior to the steps of forming the annular groove and forming the electrode-forming hole, forming a resist mask having openings for forming the annular groove and the electrode-forming hole.

In a second aspect, a method of fabricating a semiconductor device, the semiconductor device including a semiconductor wafer including a semiconductor substrate, a semiconductor element formed over a top surface of the semiconductor substrate, an interlayer insulating film formed over the top surface of the semiconductor substrate, a pad formed over the interlayer insulating film and electrically connected to the semiconductor element, and a protective film covering upper portions of the interlayer insulating film and the pads, may include forming a bottom insulating film of an insulating material on a bottom surface of the semiconductor substrate; forming an annular groove in the bottom insulating film beneath the pad and extending to the pad, and simultaneously forming an electrode-forming hole in a region circumscribed by the annular groove, the electrode-forming hole extending to the pad; forming an annular insulating layer in the annular groove while forming an insulating film on an inner surface of the electrode-forming hole by depositing an insulating material in the annular groove and in the electrode-forming hole; exposing the pad by removing an end surface of the electrode-forming hole; forming a through-silicon via that is electrically connected to the pad by depositing a conductive material in the electrode-forming hole; and forming a lower terminal beneath the bottom insulating film and electrically connected to the through-silicon via.

In a detailed embodiment of the second aspect, the method may include, prior to the step of forming the bottom insulating film, forming an upper terminal electrically connected to the pad by forming an opening in the protective film extending to the pad and depositing a conductive material in the opening.

In another detailed embodiment of the second aspect, the electrode-forming hole may be radially spaced apart from the annular groove. In a further detailed embodiment, the electrode-forming hole and the annular groove may be radially interposed by a residual portion of the semiconductor substrate.

In another detailed embodiment of the second aspect, a plurality of annular insulating layers may be formed around the through-silicon via. In a further detailed embodiment, the annular insulating layers may be arranged concentrically around the through-silicon via.

In another detailed embodiment of the second aspect, the method may include, prior to the steps of forming the annular groove and forming the electrode-forming hole, forming a resist mask having openings for forming the annular groove and the electrode-forming hole.

BRIEF DESCRIPTION OF THE DRAWINGS

The detailed description refers to the following figures in which:

FIGS. 1-11 are cross-sectional views illustrating a first exemplary semiconductor device fabrication method;

FIGS. 13-23 are cross-sectional views illustrating a second exemplary semiconductor device fabrication method;

FIGS. 24-34 are cross-sectional views illustrating a conventional fabrication method for a semiconductor device including a through-silicon via (TSV)

DETAILED DESCRIPTION

Figure 10:
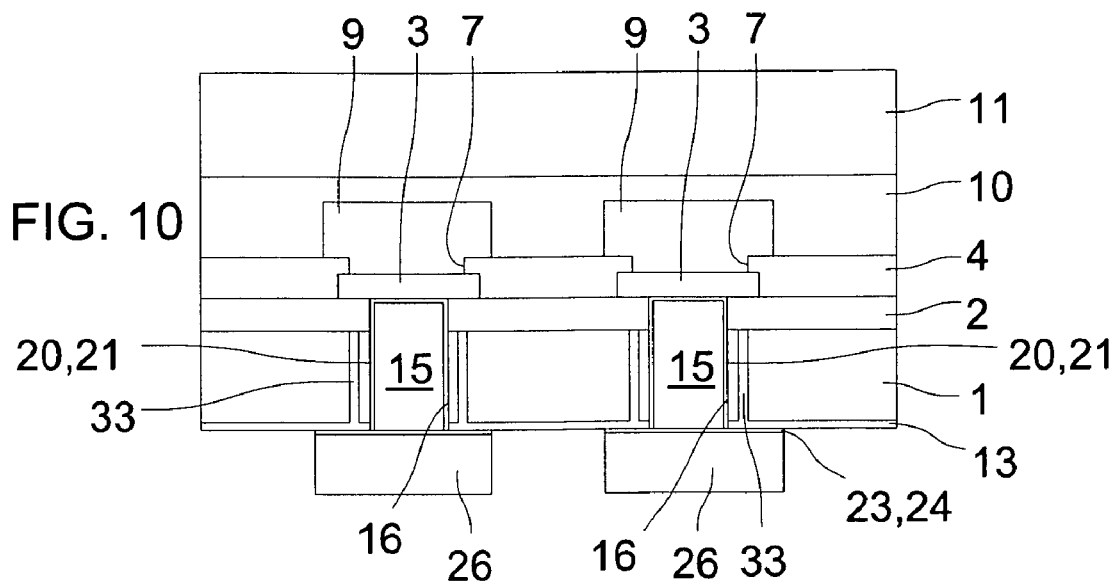
Figure 11:
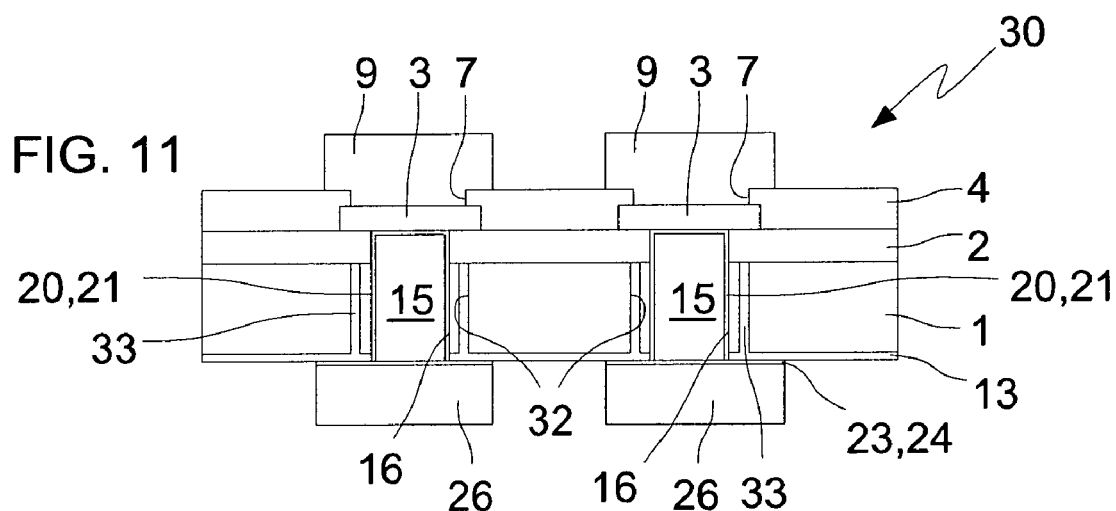
Figure 12:
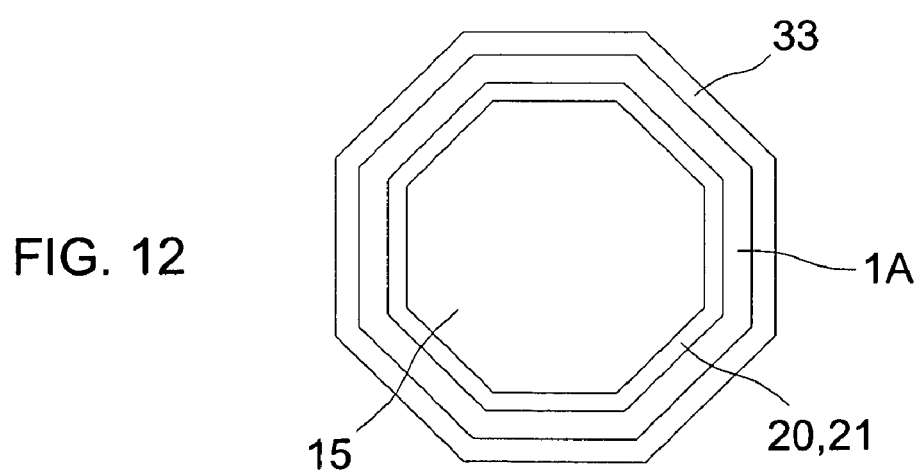
FIG. 12 is a plan view illustrating an exemplary through-silicon via (TSV) produced using the exemplary method of FIGS. 1-11.
Figure 13:
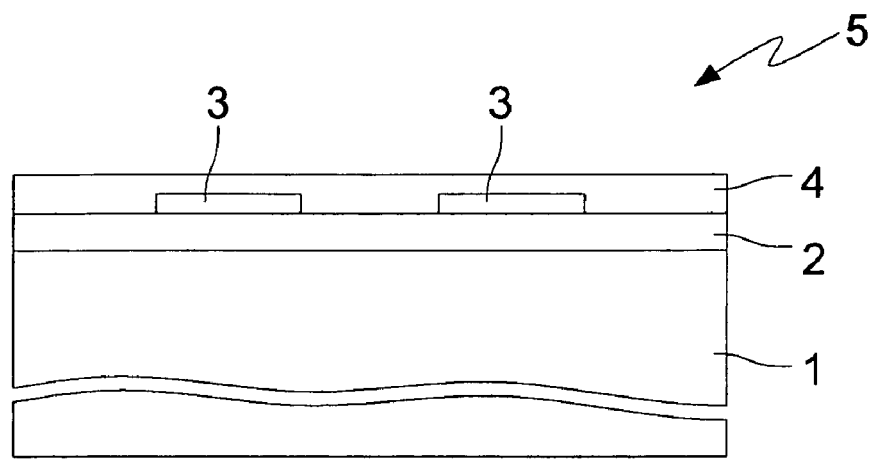
Figure 14:
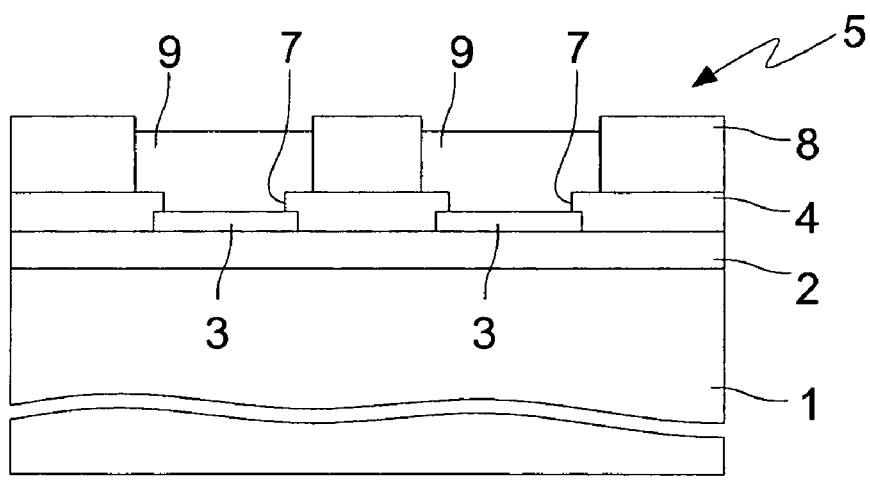
Figure 15:
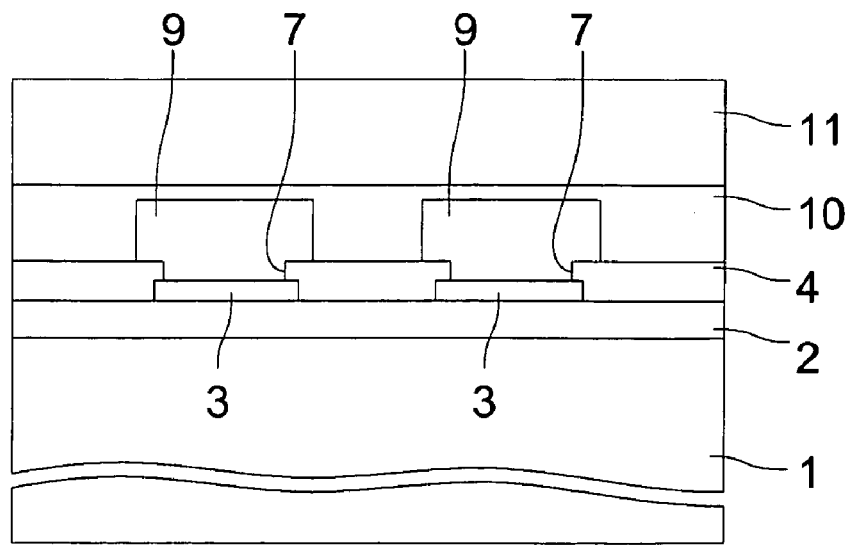
Figure 16:
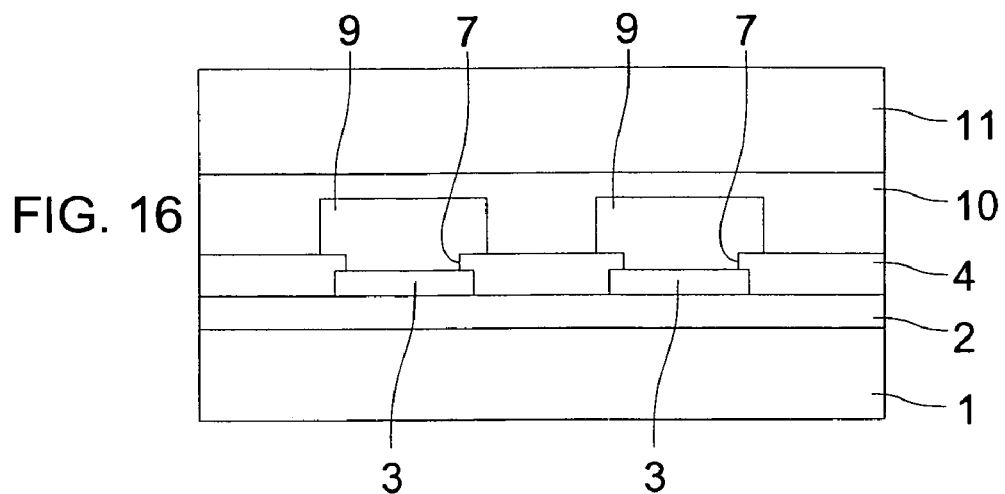

FIGS. 1-11 are cross-sectional views illustrating a first exemplary semiconductor device fabrication method, and FIG. 12 is a plan view illustrating an exemplary through-silicon via (TSV) produced using the exemplary method of FIGS. 1-11. In the following descriptions, the same or similar portions as those described in connection with the conventional fabrication method are denoted by the same reference numerals, and, thus, a redundant description thereof will be omitted.

As illustrated in FIGS. 11 and 12, an exemplary semiconductor device 30 fabricated according to the first exemplary includes a through-silicon via (TSV) 15 formed in a silicon substrate 1. The through-silicon via (TSV) is located within an annular insulating layer 33, which is connected to an interlayer insulating film 2. As described in greater detail below, the annular insulating layer 33 is formed by filling an insulating material in annular grooves 32, which extend to the interlayer insulating film 2 and which are formed around the through-silicon vias (TSV) at a predetermined distance.

As illustrated in FIG. 12, an exemplary through-silicon via (TSV) 15 has an octagonal shape and its perimeter is surrounded by the annular insulating layer 33, which also has an octagonal shape. A silicon layer 1A (which was originally part of the silicon substrate 1) interposes the through-silicon via and the annular insulating layer 33. As shown in FIG. 11, the annular insulating layer 33 electrically separates the silicon substrate 1 and the through-silicon via (TSV) 15.

An exemplary fabrication method is depicted in FIGS. 1-11. The steps illustrated in FIGS. 1-4 are generally the same as those described above with reference to FIGS. 24-27, and, thus, a redundant description thereof is omitted.

In the step of the exemplary method depicted in FIG. 5, another resist mask 8D exposing portions of a bottom surface of the silicon substrate 1 corresponding to regions below the pads 3 where annular grooves 32 are to be formed is formed on the bottom surface of the polished silicon substrate 1 by a photolithography process. Using the resist mask 8D as a mask, the silicon substrate 1 is etched by an anisotropic etching process to form the annular grooves 32 extending to the interlayer insulating film 2.

Figure 1:
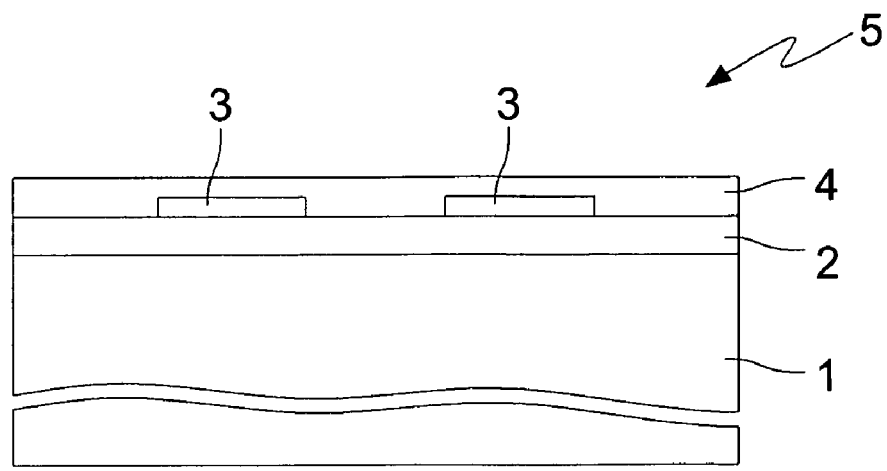
Figure 2:
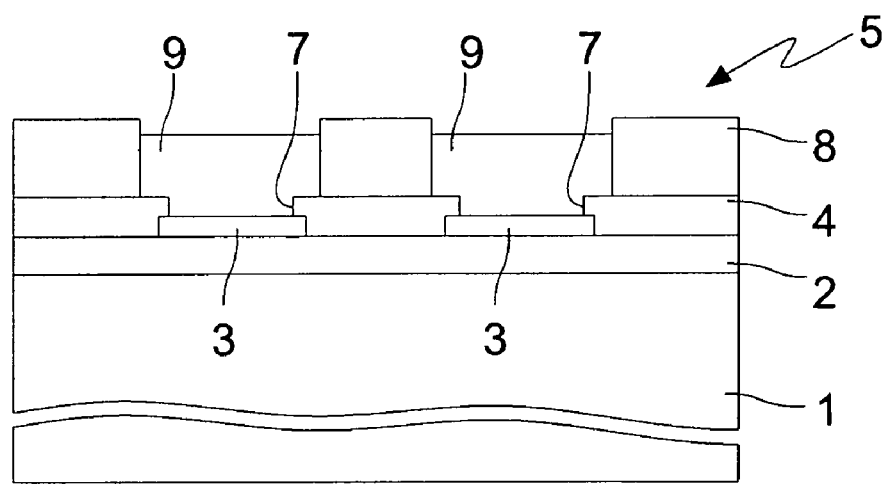
Figure 3:
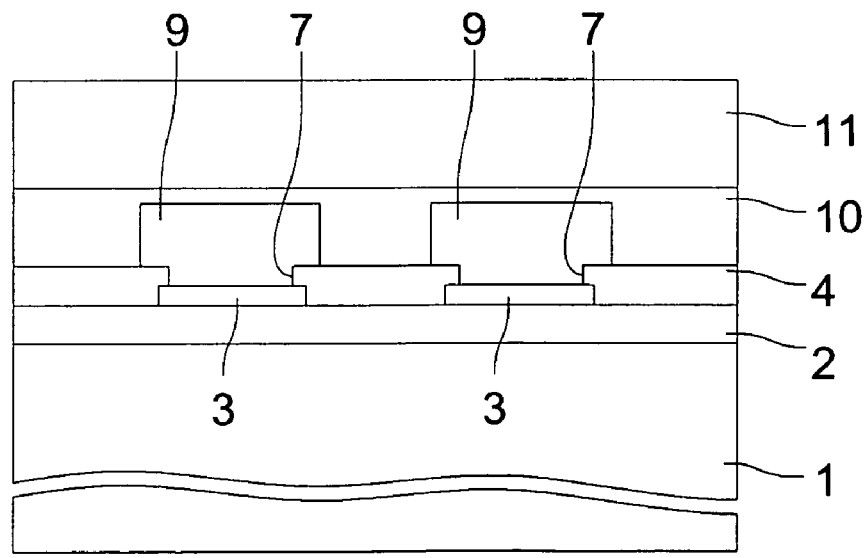
Figure 4:
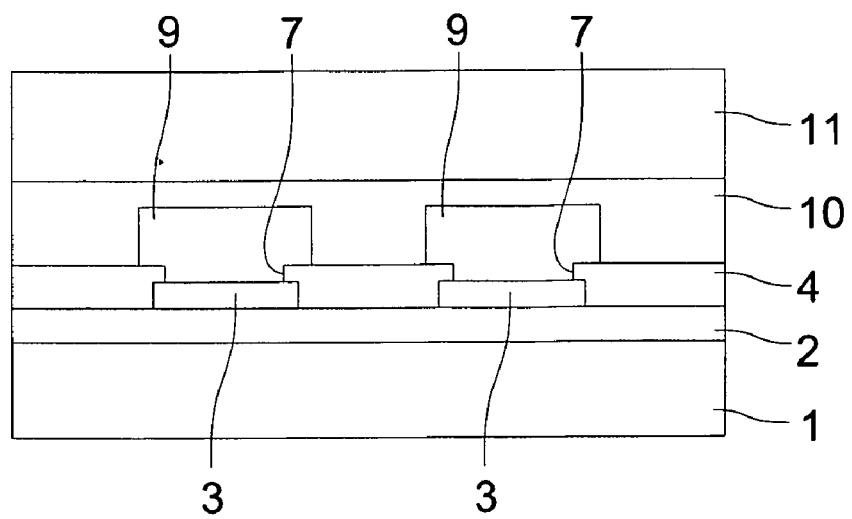
Figure 5:
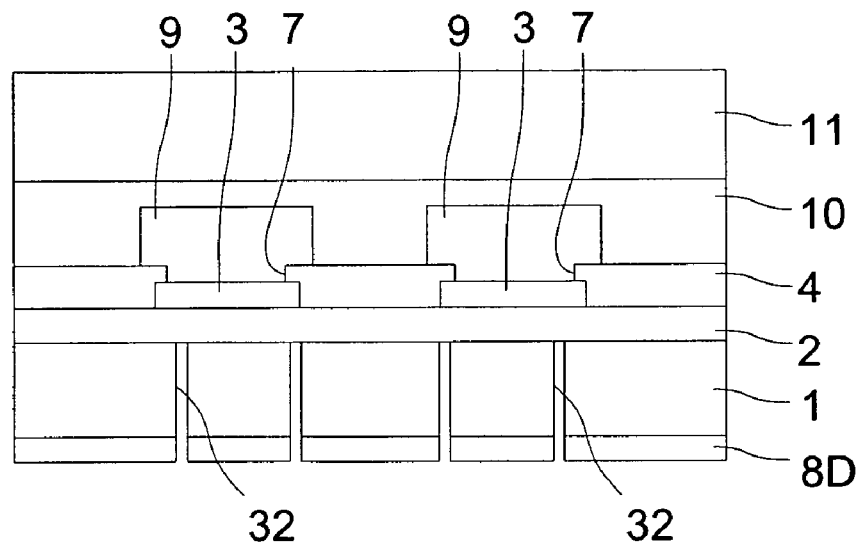
Figure 6:
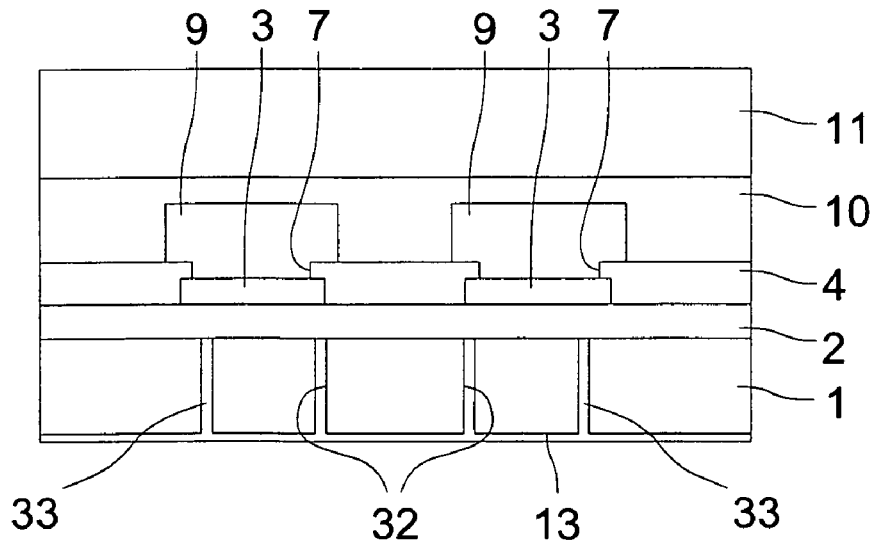

In the step of the exemplary method depicted in FIG. 6, the resist mask 8D formed in the step shown in FIG. 5 is removed by a plasma ashing process, and an insulating material (such as silicon oxide) is deposited on the bottom surface of the silicon substrate 1 and in the annular grooves 32 by a CVD method, forming annular insulating layers 33 and a bottom insulating film 13.

In the step of the exemplary method depicted in FIG. 7, another resist mask 8E exposing portions of the bottom insulating film 13 corresponding to regions below the pads 3 where through-silicon vias (TSV) 15 are to be formed (within the annular insulating layer 33) is formed on the bottom insulating film 13 by a photolithography process. Using the resist mask 8E as a mask, the bottom insulating film 13 and the silicon substrate 1 are etched by an anisotropic etching process to form pilot holes extending to the interlayer insulating film 2. Also using the same resist mask 8E as a mask, the interlayer insulating film 2 exposed to end portions of the pilot holes is etched by an anisotropic etching process using a different etching gas to form electrode-forming holes 16 extending to the pads 3.

In the step of the exemplary method depicted in FIG. 8, a conductive material (such as titanium) is deposited by a sputtering process on the bottom insulating film 13, the pads 3 (the end surfaces of the electrode-forming holes 16), and the side surfaces of the electrode-forming holes 16 to form a barrier metal layer 20. Thereafter, a conductive material (such as copper) is deposited thereon by a sputtering process to form a seed metal layer 21, and a conductive material layer 15A (such as copper) is formed on the seed metal layer 21 by an electroplating method. In this way, the conductive material (such as copper) is deposited in the electrode-forming holes 16.

In the step of the exemplary method depicted in FIG. 9, the barrier metal layer 20, the seed metal layer 21, and the conductive material layer 15A on the bottom insulating film 13 are removed using a CMP method, and through-silicon vias (TSV) 15 (which are electrically connected to the pads 3) are formed in the electrode-forming holes 16.

Figure 32:
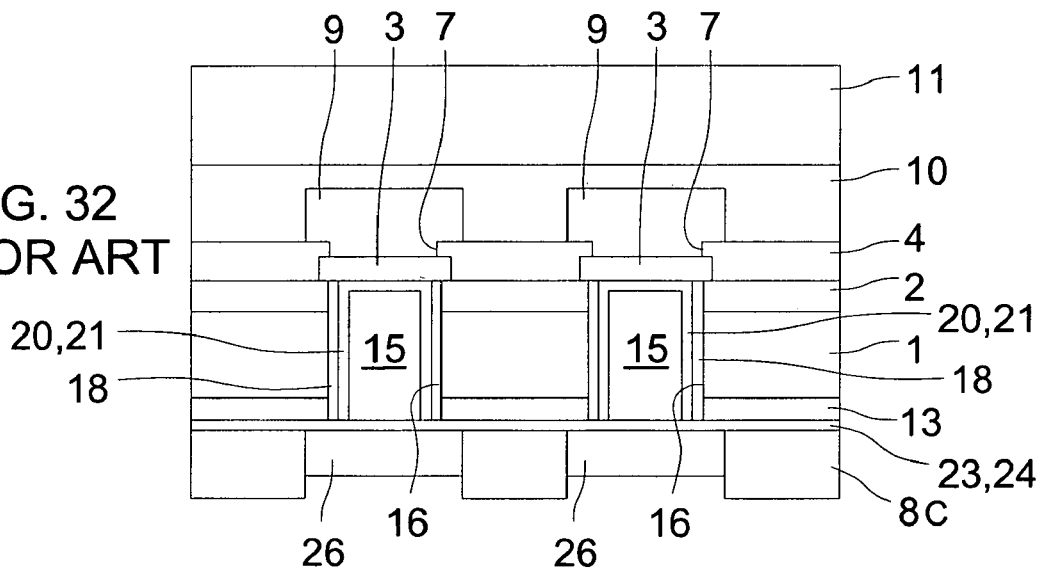

Thereafter, in a manner generally similar to the above-described step shown in FIG. 32, another barrier metal layer 23 and another seed metal layer 24 are formed, and lower terminals 26 (which are electrically connected to the through-silicon vias (TSV) 15) are formed of a conductive material (such as nickel) using a resist mask 8C'.

Figure 33:
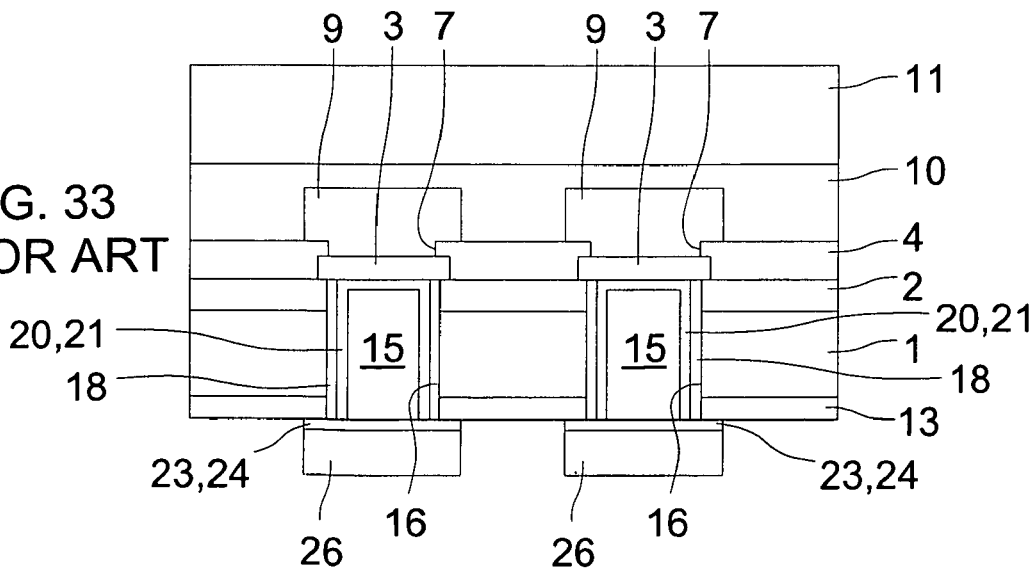
Figure 34:
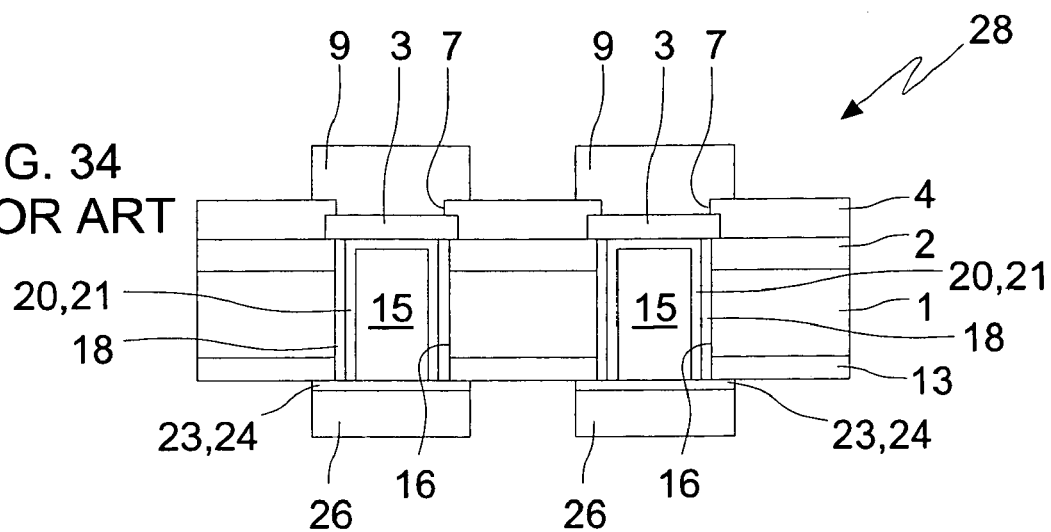

The subsequent steps illustrated in FIGS. 10 and 11 are generally similar to those illustrated in FIGS. 33 and 34, and, thus, a redundant description thereof is omitted. In this way, a semiconductor device 30 including through-silicon vias (TSV) 15 and annular insulating layers 33 may be fabricated.

As described above, the through-silicon vias (TSV) 15 formed by this exemplary via-last method are formed within annular insulating layers 33 that are connected to the interlayer insulating film 2 at a positions radially distant from the through-silicon vias (TSV) 15. Therefore, it is possible to provide stable insulation between the through-silicon vias (TSV) 15 and the silicon substrate 1. Moreover, it is possible to prevent short-circuiting between the through-silicon vias (TSV) 15 and the silicon substrate 1, and to improve the quality of the semiconductor device 30. Furthermore, it is possible to improve the safety of the via-last fabrication process.

In addition, even when a first company entrusts a second company with forming a semiconductor element on a semiconductor wafer 5, it is not necessary to rely on the second company to form the through-silicon vias (TSV) 15 or the annular insulating layers 33. Because it is possible to form the through-silicon vias (TSV) 15 and the annular insulating layers 33 in an easy and stable manner using the via-last method, the first company can form the through-silicon vias (TSV) 15 and the annular insulating layers 33 after receiving the semiconductor wafers 5 with the semiconductor elements formed thereon from the second company. Accordingly, it is possible to easily realize within one company (the first company) the fabrication of the semiconductor device 30 having the through-silicon vias (TSV) 15.

Figure 30:
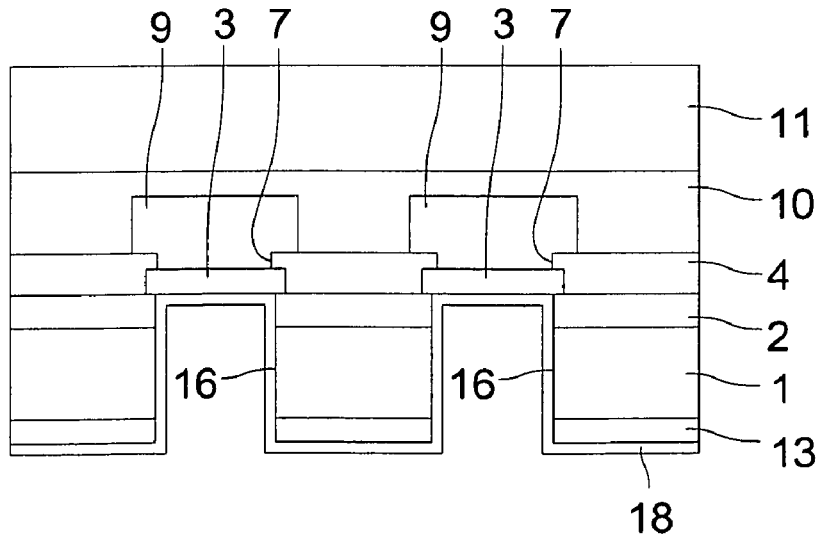
Figure 31:
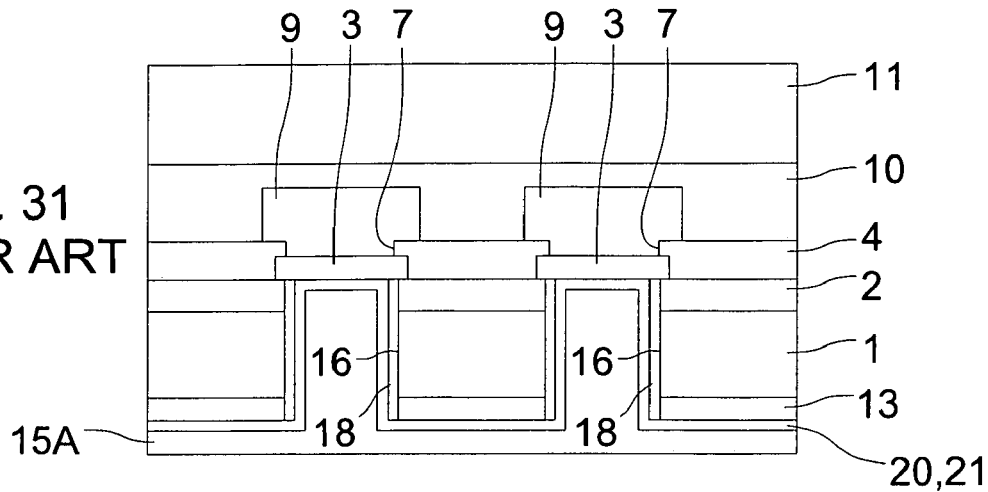

Furthermore, in the step illustrated in FIG. 6 where the annular grooves 32 are filled with the insulating material, the bottom insulating film 13 is formed simultaneously with the annular insulating layer 33. Then, the electrode-forming holes 16 extending to the pads 3 are formed. Therefore, it is possible to eliminate some steps of the conventional fabrication method, such as the step illustrated in FIG. 30, in which the electrode insulating film 18 is formed, and the step illustrated in FIG. 31, in which the electrode insulating film 18 is removed from the end surfaces of the electrode-forming holes 16 by the anisotropic etching process. Accordingly, it is possible to simplify the fabrication method of the semiconductor device 30 for forming the through-silicon vias (TSV) 15 by the via-last method.

Thus, it is possible to eliminate the step of forming the inorganic insulating film in the method of fabricating the through-silicon vias (TSV) surrounded by the insulating ring as disclosed in Japanese Laid-Open Patent Application No. 2007-180529. Therefore, compared with the method of fabricating the semiconductor device having the through-silicon vias (TSV) according to Japanese Laid-Open Patent Application No. 2007-180529, it is possible to simplify the fabrication method of the semiconductor device 30 having the through-silicon vias (TSV) 15.

As described above, the through-silicon via (TSV) is surrounded by the annular insulating layer connected to the interlayer insulating film disposed at a position radially distant from the through-silicon via (TSV). Therefore, it is possible to provide stable insulation between the through-silicon via (TSV) and the silicon substrate. Thus, it is possible to fabricate a semiconductor device having a through-silicon via (TSV) that is capable of preventing short-circuiting between the through-silicon via (TSV) and the silicon substrate in an easy and stable manner by a via-last method after delivery of a semiconductor wafer having a semiconductor element formed thereon. Accordingly, it is possible to easily realize, within one company, for example, the fabrication of a semiconductor device having a through-silicon via (TSV).

FIGS. 13-23 are cross-sectional views illustrating a second exemplary semiconductor device fabrication method.

In the following descriptions, the same or similar portions as those described in connection with the conventional fabrication method and the first exemplary method are denoted by the same reference numerals, and a redundant description thereof is omitted.

As illustrated in FIG. 23, a semiconductor device 40 formed using the second exemplary method includes through-silicon vias (TSV) 15 in a silicon substrate 1 surrounded by annular insulating layers 43. The annular insulating layers 43 are connected to an interlayer insulating film 2 and are formed by depositing an insulating material in annular grooves 42. The annular grooves 42 extend to the pads 3 formed at a predetermined distance around the through-silicon vias (TSV). Similar to the first exemplary embodiment, the silicon substrate 1 and the through-silicon vias (TSV) 15 are electrically separated from each other by the annular insulating layers 43.

An exemplary method of fabricating a semiconductor device is described with reference to FIGS. 13-23. The steps illustrated in FIGS. 13-16 are generally the same as those illustrated in FIGS. 24-27, and, thus, a redundant description thereof is omitted.

Figure 17:
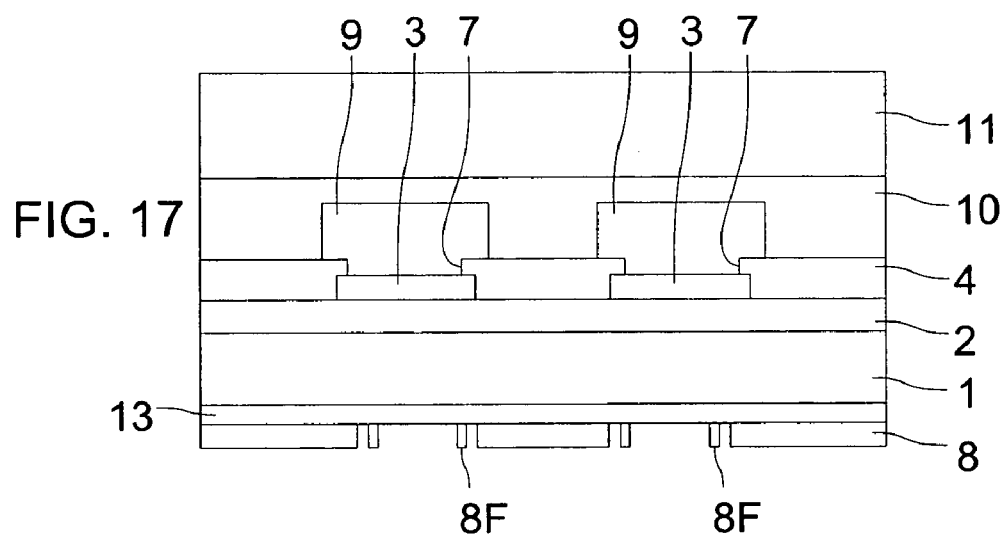

In the step of the exemplary method illustrated in FIG. 17, a bottom insulating film 13 formed of an insulating material (silicon oxide) is formed on a bottom surface of the polished silicon substrate 1 by a CVD method. Thereafter, another resist mask 8 is formed on the bottom insulating film 13 by a photolithography process, exposing portions of the bottom insulating film 13 corresponding to regions below the pads 3 where annular grooves 42 are to be formed and regions where electrode-forming holes 16 are to be formed so as to be surrounded by the annular grooves 42.

Figure 18:
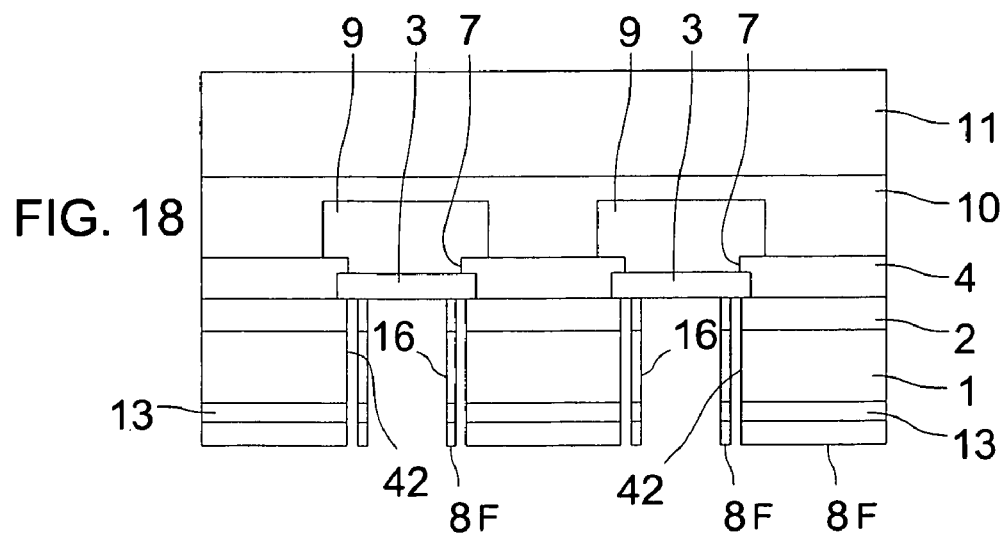

In the step of the exemplary method illustrated in FIG. 18, the bottom insulating film 13 and the silicon substrate 1 are etched (using the resist mask 8F formed in the step illustrated in FIG. 17 as a mask) by an anisotropic etching process to form pilot holes of the electrode-forming hole 16 and pilot holes of the annular grooves 42 extending to the interlayer insulating film 2. Using the same resist mask 8F as a mask, the interlayer insulating film 2 at the end portions of the pilot holes of the annular grooves 42 and the pilot holes of the electrode-forming holes 16 is etched by an anisotropic etching process using a different etching gas to extend the annular grooves 42 and the electrode-forming holes 16 to the pads 3.

Figure 19:
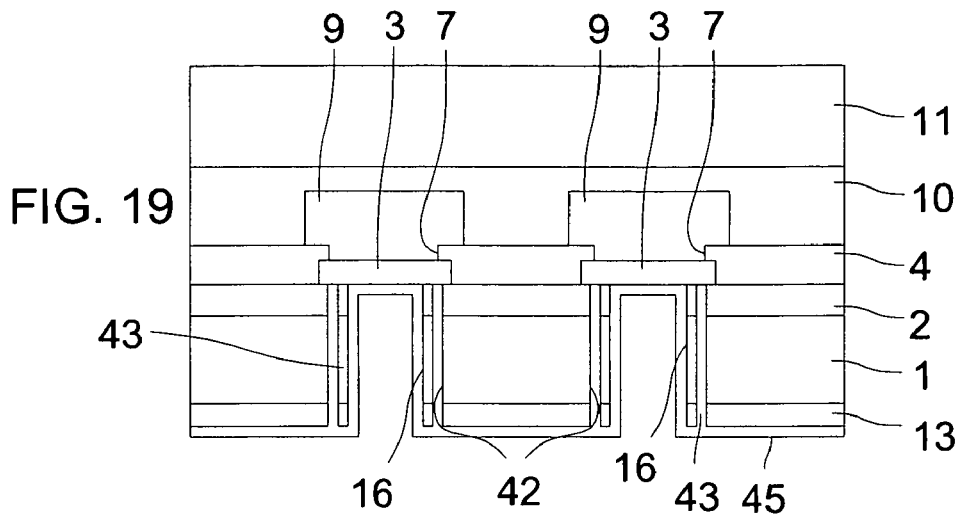

In the step illustrated of the exemplary method in FIG. 19, the resist mask 8F (the resist mask 8 that was formed in the step illustrated in FIG. 17) is removed by a plasma ashing process, and an insulating material (such as silicon oxide) is deposited on the annular grooves 42, the inner surfaces of the electrode-forming holes 16, and the bottom insulating film 13 by a CVD method. The insulating material forms an annular insulating layer 43 in the annular grooves 42 (connecting to the interlayer insulating film 2) and an insulating film 45 covering the inner surfaces of the electrode-forming holes 16 and the bottom surface of the bottom insulating film 13.

Figure 20:
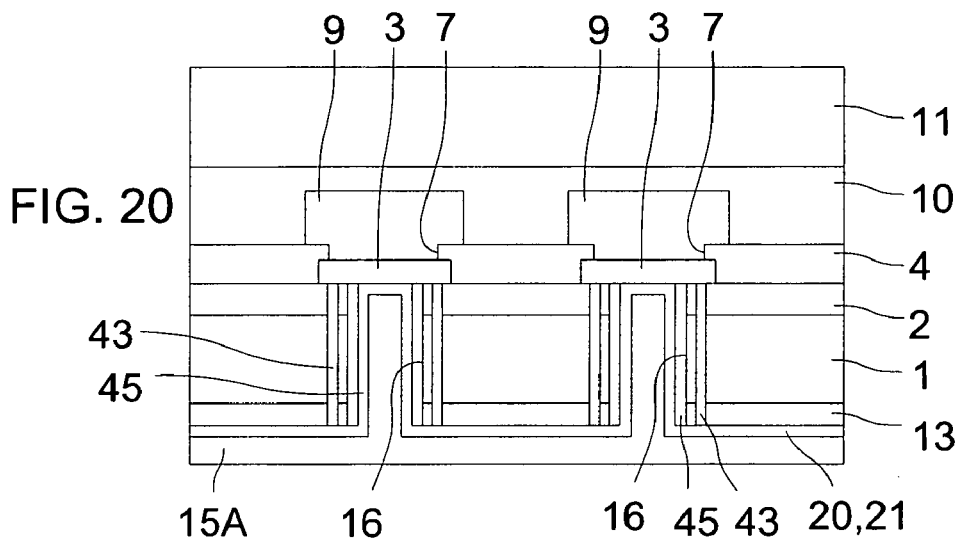

In the step of the exemplary method illustrated in FIG. 20, the entire surfaces on the bottom surface side of the silicon substrate 1 are etched by an anisotropic etching process to remove the insulating film 45 formed on the bottom insulating film 13 and the end surfaces of the electrode-forming holes 16. In this case, it is not necessary to leave the insulating film 45 formed on the side surfaces of the electrode-forming holes 16, and a portion or the entire portions thereof may be removed.

Moreover, a conductive material (such as titanium) is deposited by a sputtering process on the bottom insulating film 13, the pads 3 (the end surfaces of the electrode-forming holes 16), and the insulating film 45 disposed on the side surfaces of the electrode-forming holes 16 to form a barrier metal layer 20. Thereafter, a conductive material (such as copper) is deposited thereon by a sputtering process to form a seed metal layer 21, and a conductive material layer 15A formed of the conductive material (such as copper) is formed on the seed metal layer 21 using an electroplating method. In this way, the conductive material (such as copper) is deposited on the electrode-forming holes 16.

Figure 21:
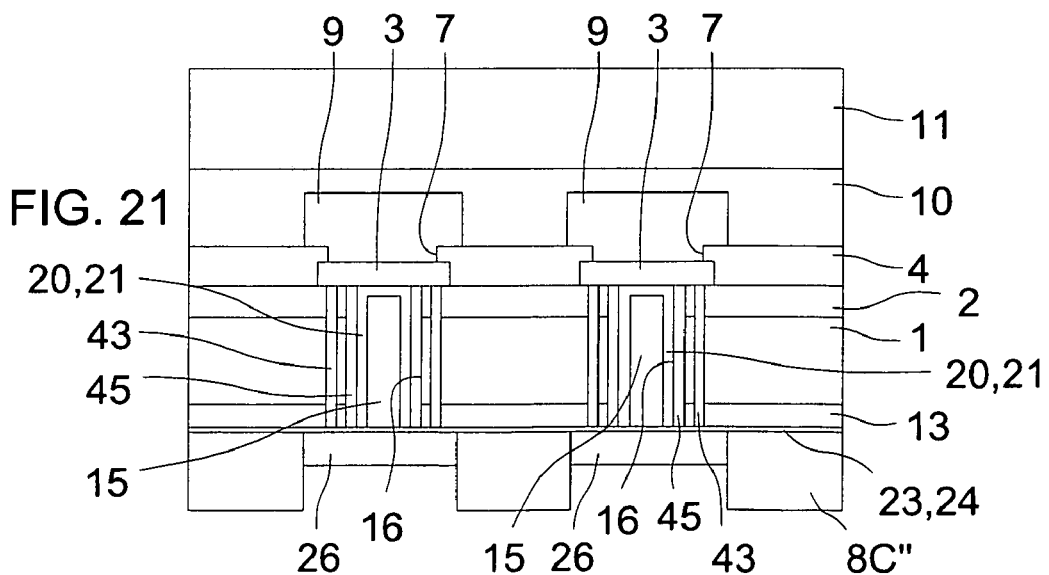
Figure 25:
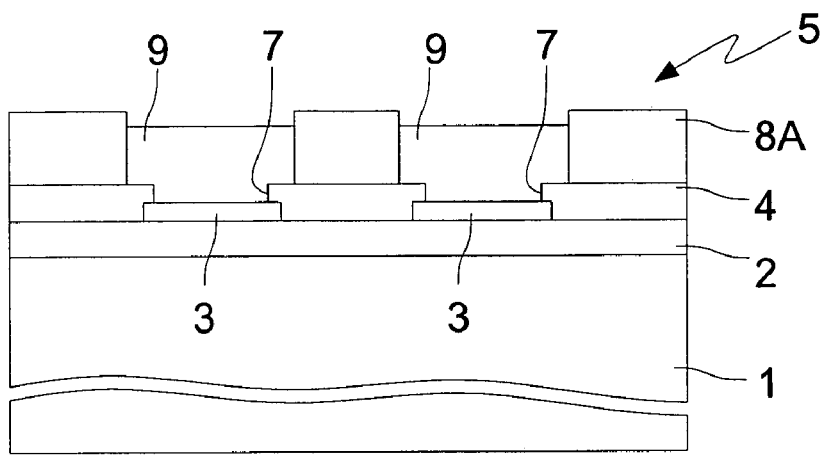
Figure 26:
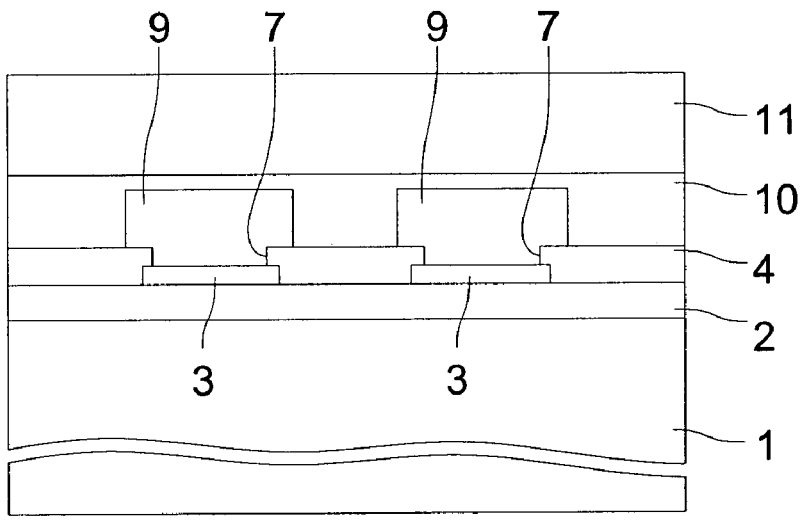
Figure 27:
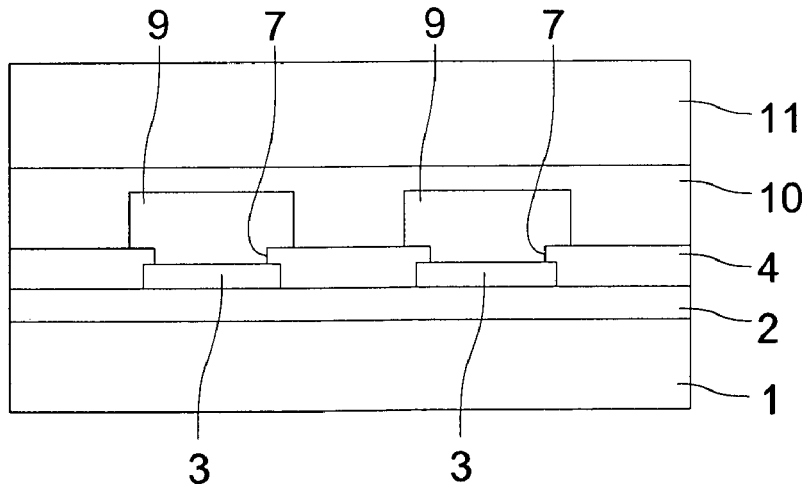
Figure 28:
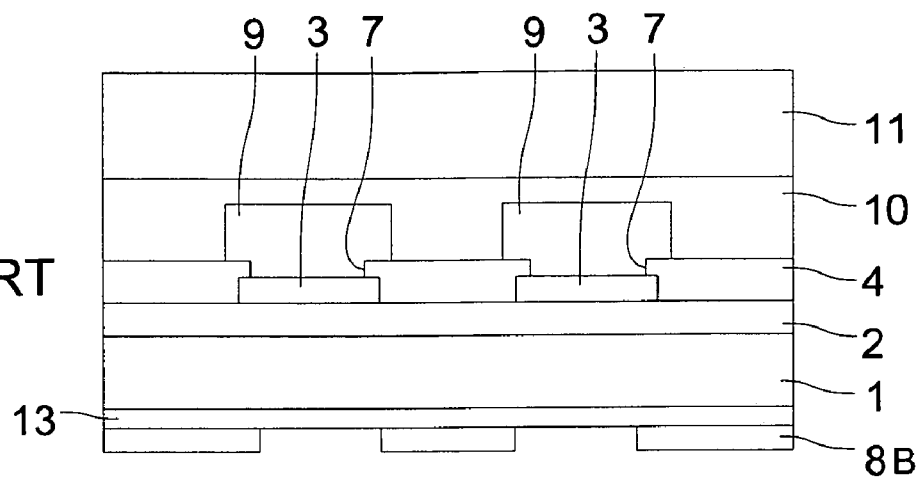
Figure 29:
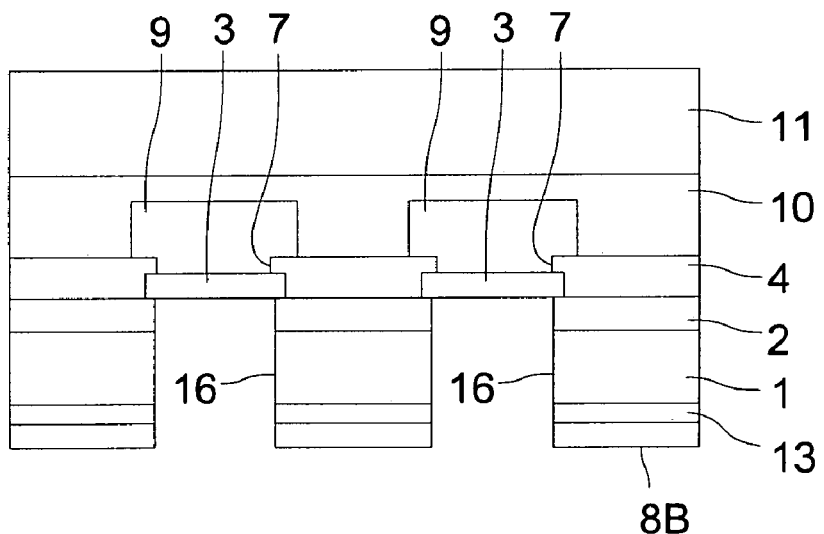

In the step method illustrated in FIG. 21, the barrier metal layer 20, the seed metal layer 21, and the conductive material layer 15A on the bottom insulating film 13 are removed using a CMP method. Through-silicon vias (TSV) 15 in the electrode-forming holes 16 are electrically connected to the pads 3. Thereafter, in a manner similar to the above-described step illustrated in FIG. 32, another barrier metal layer 23 and another seed metal layer 24 are formed, and lower terminals 26 are formed (of a conductive material such as nickel and using resist mask 8C") so as to be electrically connected to the through-silicon vias (TSV) 15.

The operations of the subsequent steps illustrated in FIGS. 22 and 23 are generally the same as those of the steps illustrated in FIGS. 33 and 34, and, thus, a redundant description thereof will be omitted.

Using this exemplary method, a semiconductor device 40 including through-silicon vias (TSV) 15 having their perimeters surrounded by the annular insulating layers 43 may be formed.

As described above, the through-silicon vias (TSV) 15 formed by the via-last method according to this exemplary method have their perimeters at least partially surrounded by the annular insulating layers 43 which are connected to the interlayer insulating film 2 and which are disposed at a position distant from the through-silicon vias (TSV) 15. Therefore, it is possible to provide stable insulation between the through-silicon vias (TSV) 15 and the silicon substrate 1. Moreover, it is possible to prevent short-circuiting between the through-silicon vias (TSV) 15 and the silicon substrate 1, and to thus improve the quality of the semiconductor device 40. Furthermore, it is possible to improve the safety of a fabrication process using the via-last method.

In addition, even in a case where a first company entrusts a second company with forming the semiconductor element on the semiconductor wafer 5, it is not necessary to rely on the second company to form the through-silicon vias (TSV) 15 or the annular insulating layer 43. Therefore, it is possible to form the through-silicon vias (TSV) 15 surrounded by the annular insulating layer 43 in an easy and stable manner using the via-last method within the first company after receiving the semiconductor wafer 5 having the semiconductor element formed thereon from the second company. Accordingly, it is possible to easily realize within one company (the first company) the fabrication of the semiconductor device 40 having the through-silicon vias (TSV) 15.

Furthermore, since the annular grooves 42 and the electrode-forming holes 16 are formed at the same time, it is possible form a semiconductor device 40 having the through-silicon vias (TSV) 15 by the via-last method using the same fabrication line as a conventional fabrication method. Moreover, since the resist mask 8F to be used for forming the annular grooves 42 and the electrode-forming holes 16 can be formed at the same time, it is not necessary to consider alignment between the resist mask 8F for forming the annular grooves 42 and the resist mask 8F for forming the electrode-forming holes 16. Therefore, it is possible to reduce the size of the semiconductor device 40.

This means that it is possible to prevent misalignment of a resist mask in the electrode-forming hole forming step in the process steps of the through-silicon vias (TSV) surrounded by the insulating ring as disclosed in Japanese Laid-Open Patent Application No. 2007-180529. Therefore, compared with the process steps of the semiconductor device having the through-silicon vias (TSV) according to Japanese Laid-Open Patent Application No. 2007-180529, it is possible to further simplify the fabrication method of the semiconductor device 40 having the through-silicon vias (TSV) 15.

As described above, it is possible to fabricate a semiconductor device having a through-silicon via (TSV) capable of preventing short-circuiting between the through-silicon via (TSV) and the silicon substrate in an easy and stable manner by a via-last method after delivery of a semiconductor wafer having a semiconductor element formed thereon. Accordingly, it is possible to easily realize, within one company, the fabrication of a semiconductor device having a through-silicon via (TSV).

Figure 35:
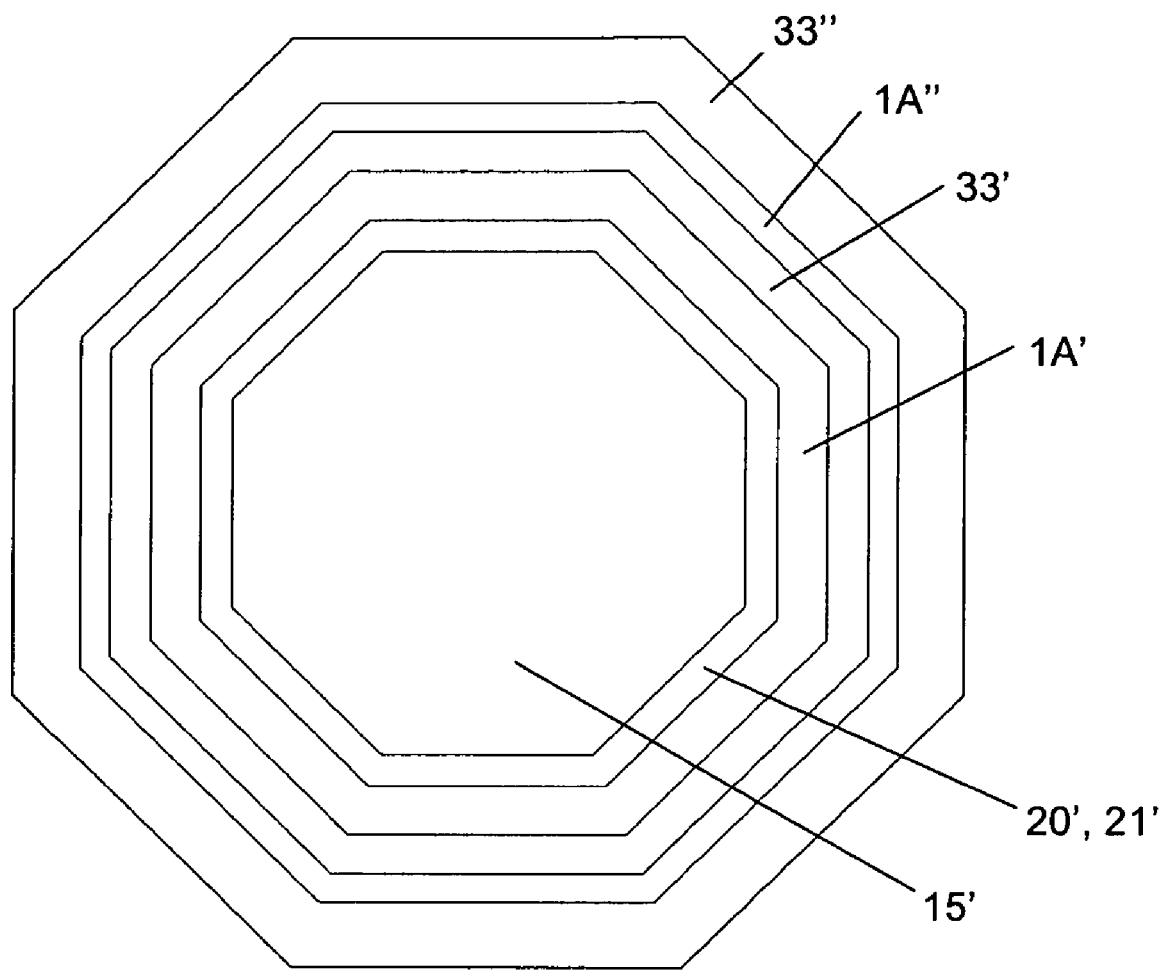
FIG. 35 is a plan view illustrating an exemplary through-silicon via (TSV) including a plurality of concentrically arranged annular insulating layers.

Although the above-described exemplary embodiments include a single annular insulating layer provided around each through-silicon via (TSV), a plurality of annular insulating layers may be provided around each through-silicon via (TSV). For example, a plurality of annular insulating layers may be provided concentrically around a through-silicon via (TSV). See, for example, FIG. 35, which depicts an exemplary through-silicon via (TSV) 15' (with a barrier metal layer 20' and a seed metal layer 21') located within a first annular insulating layer 33'. A silicon layer 1A' interposes the through-silicon via 15' and the first annular insulating layer 33'. A second silicon layer 1A" surrounds the first annular insulating layer 33', and a second annular insulating layer 33" surrounds the second silicon layer 1A".

Further, while the exemplary embodiments described above include octagonal through-silicon vias and annular insulating layers, it is within the scope of the disclosure to form either or both of them in other shapes, such as circular, elliptical, or tetragonal shapes.

While exemplary embodiments have been set forth above for the purpose of disclosure, modifications of the disclosed embodiments as well as other embodiments thereof may occur to those skilled in the art. Accordingly, it is to be understood that the disclosure is not limited to the above precise embodiments and that changes may be made without departing from the scope. Likewise, it is to be understood that it is not necessary to meet any or all of the stated advantages or objects disclosed herein to fall within the scope of the disclosure, since inherent and/or unforeseen advantages of the may exist even though they may not have been explicitly discussed herein.

What is claimed is:

1. A method of fabricating a semiconductor device, the semiconductor device including a semiconductor wafer including a semiconductor substrate, a semiconductor element formed over a top surface of the semiconductor substrate, an interlayer insulating film formed over the top surface of the semiconductor substrate, a pad formed over the interlayer insulating film and electrically connected to the semiconductor element, and a protective film covering upper portions of the interlayer insulating film and the pad, the method comprising:

forming an annular goove extending from a bottom surface of the semiconductor substrate beneath the pad to the interlayer insulating film;

forming an annular insulating layer in the annular groove and a bottom insulating film beneath the bottom surface of the semiconductor substrate by depositing an insulating material in the annular groove and on the bottom surface of the semiconductor substrate;

forming an electrode-forming hole in a region circumscribed by the annular insulating layer, the electrode-forming hole extending from the bottom insulating film to the pad;

forming a through-silicon via electrically connected to the pad by depositing a conductive material in the electrode-forming hole; and forming a lower terminal beneath the bottom insulating film and electrically connected to the through-silicon via.

2. The method of claim 1, further comprising, prior to the step of forming the annular groove, forming an upper terminal electrically connected to the pad by forming an opening in the protective film extending to the pad and depositing a conductive material in the opening.

3. The method of claim 1, wherein the electrode-forming hole is radially spaced apart from the annular insulating layer.

4. The method of claim 3, wherein the electrode-forming hole and the annular insulating layer are radially interposed by a residual portion of the semiconductor substrate.

5. The method of claim 1, wherein a plurality of annular insulating layers is formed around the through-silicon via.

6. The method of claim 5, wherein the annular insulating layers are arranged concentrically around the through-silicon via.

7. The method of claim 1, further comprising:
   prior to the step of forming the annular groove, forming a resist mask having an opening for forming the annular goove; and
   prior to the step of forming the electrode forming hole and subsequent to the step of forming the annular groove, forming an electrode forming hole resist mask having an opening for forming the electrode forming hole.

8. A method of fabricating a semiconductor device, the semiconductor device including a semiconductor wafer including a semiconductor substrate, a semiconductor element formed over a top surface of the semiconductor substrate, an interlayer insulating film formed over the top surface of the semiconductor substrate, a pad formed over the interlayer insulating film and electrically connected to the semiconductor element, and a protective film covering upper portions of the interlayer insulating film and the pads, the method comprising:
   forming a bottom insulating film of an insulating material on a bottom surface of the semiconductor substrate;
   forming an annular groove in the bottom insulating film beneath the pad and extending to the pad, and simultaneously forming an electrode-forming hole in a region circumscribed by the annular groove, the electrode-forming hole extending to the pad;
   forming an annular insulating layer in the annular groove while forming an insulating film on an inner surface of the electrode-forming hole by depositing an insulating material in the annular groove and in the electrode-forming hole;
   exposing the pad by removing an end surface of the electrode-forming hole;
   forming a through-silicon via that is electrically connected to the pad by depositing a conductive material in the electrode-forming hole; and
   forming a lower terminal beneath the bottom insulating film and electrically connected to the through-silicon via.

9. The method of claim 8, further comprising, prior to the step of forming the bottom insulating film, forming an upper terminal electrically connected to the pad by forming an opening in the protective film extending to the pad and depositing a conductive material in the opening.

10. The method of claim 8, wherein the electrode-forming hole is radially spaced apart from theannular groove.

11. The method of claim 10, wherein the electrode-forming hole and the annular groove are radially interposed by a residual portion of the semiconductor substrate.

12. The method of claim 8, wherein a plurality of annular insulating layers is formed around the through-silicon via.

13. The method of claim 12, wherein the annular insulating layers are arranged concentrically around the through-silicon via.

14. The method of claim 8, further comprising, prior to the steps of forming the annular groove and forming the electrode-forming hole, forming a resist mask having openings for forming the annular groove and the electrode-forming hole.

15. A method of fabricating a semiconductor device, the semiconductor device including a semiconductor wafer including a semiconductor substrate, an interlayer insulating film formed over the top surface of the semiconductor substrate, a pad formed over the interlayer insulating film and electrically connected to the semiconductor element, and a protective film covering upper portions of the interlayer insulating film and the pad, the method comprising:
   forming a groove extending from a bottom surface of the semiconductor substrate beneath the pad to at least the interlayer insulating film;
   forming an electrode-forming hole in a region circumscribed by the groove and spaced apart from the groove, the electrode-forming hole extending to the pad;
   at least substantially filling the groove with an insulating material;
   forming an insulating side wall lining spaced apart from the insulating material filling the groove; and
   forming a through-silicon via electrically connected to the pad by depositing a conductive material in the electrode-forming hole.

16. The method of claim 15, further comprising the step of forming a lower terminal electrically connected to the through-silicon via.

17. A method of fabricating a semiconductor device, the semiconductor device including a semiconductor wafer including a semiconductor substrate, an interlayer insulating film formed over the top surface of the semiconductor substrate, a pad formed over the interlayer insulating film and electrically connected to the semiconductor element, and a protective film covering upper portions of the interlayer insulating film and the pad, the method comprising:
   forming a groove extending from a bottom surface of the semiconductor substrate beneath the pad to at least the interlayer insulating film, the groove encompassing and retaining at least a portion of the semiconductor substrate beneath the pad when the groove is formed;
   forming an insulating layer in the groove and a bottom insulating film beneath the bottom surface of the semiconductor substrate by depositing an insulating material in the groove and on the bottom surface of the semiconductor substrate;

forming an electrode-forming hole through the retained semiconductor substrate encompassed by the insulating layer within the groove, the electrode-forming hole extending from the bottom insulating film to the pad and is bound by a portion of the retained semiconductor substrate;

forming a through-silicon via electrically connected to the pad by depositing a conductive material in the electrode-forming hole; and forming a lower terminal electrically connected to the through-silicon via;

wherein at least a portion of the semiconductor substrate interposes the conductive material and the insulating layer.

18. A method of fabricating a semiconductor device, the semiconductor device including a semiconductor wafer including a semiconductor substrate, an interlayer insulating film formed over the top surface of the semiconductor substrate, a pad formed over the interlayer insulating film and electrically connected to the semiconductor element, and a protective film covering upper portions of the interlayer insulating film and the pad, the method comprising:

forming a groove extending from a bottom surface of the semiconductor substrate beneath the pad to at least the interlayer insulating film;

forming an insulating layer in the groove and a bottom insulating film beneath the bottom surface of the semiconductor substrate by depositing an insulating material in the groove and on the bottom surface of the semiconductor substrate;

forming an electrode-forming hole in a region encompassed by the insulating layer and spaced apart from the insulating layer, the electrode-forming hole extending from the bottom insulating film to the pad;

forming a through-silicon via electrically connected to the pad by depositing a conductive material in the electrode-forming hole; and forming a lower terminal electrically connected to the through-silicon via.

* * * * *